United States Patent
Ye et al.

(10) Patent No.: US 12,271,093 B2
(45) Date of Patent: Apr. 8, 2025

(54) DISPLAY PANEL AND DISPLAY DEVICE

(71) Applicant: WUHAN CHINA STAR OPTOELECTRONICS TECHNOLOGY CO., LTD., Wuhan (CN)

(72) Inventors: Wenlong Ye, Wuhan (CN); Wei Cheng, Wuhan (CN)

(73) Assignee: WUHAN CHINA STAR OPTOELECTRONICS TECHNOLOGY CO., LTD., Wuhan (CN)

(*) Notice: Subject to any disclaimer, the term of this patent is extended or adjusted under 35 U.S.C. 154(b) by 0 days.

(21) Appl. No.: 18/010,652

(22) PCT Filed: Nov. 3, 2022

(86) PCT No.: PCT/CN2022/129596
§ 371 (c)(1),
(2) Date: Dec. 16, 2022

(87) PCT Pub. No.: WO2024/036761
PCT Pub. Date: Feb. 22, 2024

(65) Prior Publication Data
US 2024/0241419 A1 Jul. 18, 2024

(30) Foreign Application Priority Data
Aug. 18, 2022 (CN) .......................... 202210991612.6

(51) Int. Cl.
*G02F 1/166* (2019.01)
(52) U.S. Cl.
CPC .................................... *G02F 1/166* (2019.01)
(58) Field of Classification Search
CPC ......... G02F 1/166; G02F 1/167; H10K 50/85; H10K 59/50
See application file for complete search history.

(56) References Cited

U.S. PATENT DOCUMENTS

2012/0188295 A1* 7/2012 Joo .......................... G02F 1/17
345/690

FOREIGN PATENT DOCUMENTS

| CN | 104133319 A | 11/2014 |
|---|---|---|
| CN | 106773444 A | 5/2017 |

(Continued)

OTHER PUBLICATIONS

International Search Report in International application No. PCT/CN2022/129596, mailed on Apr. 28, 2023, 7 pages with English translation.

(Continued)

*Primary Examiner* — James C. Jones
(74) *Attorney, Agent, or Firm* — PV IP PC; Wei Te Chung

(57) ABSTRACT

A display panel and a display device are provided. The display panel includes a substrate; a light-emitting layer disposed on the substrate; a plurality of separating plates disposed on the light-emitting layer; an encapsulation layer disposed on the plurality of separating plate; and a viewing angle switching assembly disposed in the accommodating cavity. The substrate, the plurality of separating plates, and the encapsulation layer define an accommodating cavity. The viewing angle switching assembly includes a sidewall electrode disposed on the separating plate and charged particles having a first electrical polarity disposed in the accommodating cavity. In a private protection mode, the sidewall electrode has a second electrical polarity opposite to the first electrical polarity.

20 Claims, 2 Drawing Sheets

(56) References Cited

FOREIGN PATENT DOCUMENTS

| CN | 108375858 A | 8/2018 |
| CN | 109709738 A | 5/2019 |

OTHER PUBLICATIONS

Written Opinion of the International Search Authority in International application No. PCT/CN2022/129596, mailed on Apr. 28, 2023, 6 pages with English translation.

* cited by examiner

DISPLAY PANEL AND DISPLAY DEVICE

The present application is a U.S. national phase application of a PCT Application No. PCT/CN2022/129596 filed on Nov. 3, 2022, which claims a priority to Chinese Patent Application No. 202210991612.6 filed in China on Aug. 18, 2022 a disclosure of which are incorporated in their entireties by reference herein.

TECHNICAL FIELD

The present disclosure relates to a field of display technology, and more particularly, to a display panel and a display device.

BACKGROUND

Display devices are popular increasingly, and users pay more attention to protect personal information. Concept of private protection is gradually focused on by the user. It is common to attach a privacy film on a display panel, however, the privacy film does not have a function of switching between private protection mode and display sharing mode of the display panel. For switching between private protection mode and display sharing mode, a dimming box may be provided with the display panel, but it may greatly increase a thickness of the display panel.

Technical Problem

A common solution is to provide a privacy film attached on a display panel; however, the common privacy film does not have a function of switching between private protection mode and display sharing mode of the display device.

SUMMARY

An embodiment of the present disclosure provides a display panel and a display device, in which a sidewall electrode and charged particles are disposed on a side wall of a separating plate. Charged particles are attracted by controlling the electrical polarity of the sidewall electrode, thereby achieving switching between a display sharing mode and a private protection mode.

According to a first aspect, an embodiment of the present disclosure provides a display panel including:
  a substrate;
  a light-emitting layer disposed on the substrate;
  a plurality of separating plates disposed on the light-emitting layer;
  an encapsulation layer disposed on a side of the separating plate away from the substrate, wherein the substrate, the plurality of separating plates, and the encapsulation layer define a plurality of accommodating cavities; and
  a viewing angle switching assembly provided in each of the plurality of accommodating cavities and in a one-to-one correspondence with the accommodating cavity, wherein the viewing angle switching assembly includes a sidewall electrode provided on a side wall of the separating plate and charged particles provided in the accommodating cavity, each of the charged particles has a first electrical polarity, and an outer surface of the charged particle includes an light-absorbing region; wherein in a private protection mode, the sidewall electrode is configured to have a second electrical polarity, the light-absorbing region is toward an inner of the accommodating cavity, and the first electrical polarity and the second electrical polarity are opposite;
  wherein the light-emitting layer includes a light-emitting unit provided in the accommodating cavity, the light-emitting unit is disposed on the substrate, and the viewing angle switching assembly is disposed between the light-emitting unit and the encapsulation layer; wherein the light-emitting unit includes an anode layer, a light-emitting layer, a cathode layer, and a cathode insulating layer stacked in sequence, and the anode layer is disposed on the substrate, and wherein the viewing angle switching assembly is disposed between the cathode insulating layer and the encapsulation layer.

In some embodiments, the outer surface of the charged particle further includes a reflecting region; wherein the light-absorbing region has the second electrical polarity, and the reflecting region has the first electrical polarity; and wherein in a display sharing mode, the sidewall electrode is configured to have the first electrical polarity.

In some embodiments, an area of the light-absorbing region is greater than or equal to the area of the reflecting region.

In some embodiments, the viewing angle switching assembly further includes charged reflective particles disposed in the accommodating cavity, and the charged reflective particles have the second electrical polarity; and wherein the sidewall electrode is configured to have the first electrical polarity in a display sharing mode.

In some embodiments, the display panel further includes an anode insulating layer provided between the anode layers of adjacent light-emitting units, and the separating plate is disposed between the anode insulating layer and the encapsulation layer.

According to a second aspect, an embodiment of the present disclosure provides a display panel including:
  a substrate;
  a light-emitting layer disposed on the substrate;
  a plurality of separating plates disposed on the light-emitting layer;
  an encapsulation layer disposed on a side of the separating plate away from the substrate, wherein the substrate, the plurality of separating plates, and the encapsulation layer define a plurality of accommodating cavities; and
  a viewing angle switching assembly provided in each of the plurality of accommodating cavities and in a one-to-one correspondence with the accommodating cavity, wherein the viewing angle switching assembly includes a sidewall electrode provided on a side wall of the separating plate and charged particles provided in the accommodating cavity, each on the charged particles has a first electrical polarity, and an outer surface of the charged particle includes an light-absorbing region; wherein in a private protection mode, the sidewall electrode is configured to have a second electrical polarity, the light-absorbing region toward an inner of the accommodating cavity, and the first electrical polarity and the second electrical polarity are opposite.

In some embodiments, the outer surface of the charged particle further includes a light-absorbing region and a reflecting region; wherein the light-absorbing region has the second electrical polarity, and the reflecting region has the first electrical polarity; and wherein in a display sharing mode, the sidewall electrode is configured to have the first electrical polarity.

In some embodiments, an area of the light-absorbing region is greater than or equal to the area of the reflecting region.

In some embodiments, the viewing angle switching assembly further includes charged reflective particles disposed in the accommodating cavity, and the charged reflective particles have the second electrical polarity; and wherein the sidewall electrode is configured to have the first electrical polarity in a display sharing mode.

In some embodiments, the light-emitting layer includes a light-emitting unit provided in the accommodating cavity, the light-emitting unit is disposed on the substrate, and the viewing angle switching assembly is disposed between the light-emitting unit and the encapsulation layer.

In some embodiments, the light-emitting unit includes an anode layer, a light-emitting layer, a cathode layer, and a cathode insulating layer stacked in sequence, and the anode layer is disposed on the substrate, and wherein the viewing angle switching assembly is disposed between the cathode insulating layer and the encapsulation layer.

In some embodiments, the display panel further includes an anode insulating layer provided between the anode layers of adjacent light-emitting units, and the separating plate is disposed between the anode insulating layer and the encapsulation layer.

In some embodiments, a thickness of the anode insulating layer is greater than a thickness of the anode layer, and a direction of the thickness is a stacking direction of each film layer in the light-emitting unit.

In some embodiments, an adhesive layer is provided between the substrate and the separating plate and between the separating plate and the encapsulation layer.

In some embodiments, ends of the sidewall electrode abut between the substrate and the encapsulation layer, respectively.

In some embodiments, the accommodating cavity is provided with a dispersion medium.

According to a third aspect, the present disclosure provides a display device including the display panel of any one of the above display panel.

In some embodiments, the display panel includes:
a substrate;
a light-emitting layer provided on the substrate;
a plurality of separating plates provided on the light-emitting layer;
an encapsulation layer disposed on a side of the separating plate away from the substrate, wherein the substrate, the plurality of separating plates, and the encapsulation layer define a plurality of accommodating cavities; and
a viewing angle switching assembly provided in each of the plurality of accommodating cavities and in a one-to-one correspondence with the accommodating cavity, wherein the viewing angle switching assembly includes a sidewall electrode provided on a side wall of the separating plate and charged particles provided in the accommodating cavity, each of the charged particles has a first electrical polarity; wherein in a private protection mode, the sidewall electrode is configured to have a second electrical polarity, and the first electrical polarity and the second electrical polarity are opposite.

In some embodiments, the outer surface of the charged particle further includes a light-absorbing region and a reflecting region; wherein the light-absorbing region has the second electrical polarity, and the reflecting region has the first electrical polarity; and wherein in a display sharing mode, the sidewall electrode is configured to have the first electrical polarity.

In some embodiments, an area of the light-absorbing region is greater than or equal to an area of the reflecting region.

In some embodiments, the viewing angle switching assembly further includes charged reflective particles disposed in the accommodating cavity, and the charged reflective particles have the second electrical polarity; and wherein the sidewall electrode is configured to have the first electrical polarity in a display sharing mode.

In some embodiments, the light-emitting layer includes a light-emitting unit provided in the accommodating cavity, the light-emitting unit is disposed on the substrate, and the viewing angle switching assembly is disposed between the light-emitting unit and the encapsulation layer.

In some embodiments, the light-emitting unit includes an anode layer, a light-emitting layer, a cathode layer, and a cathode insulating layer stacked in sequence, and the anode layer is disposed on the substrate, and wherein the viewing angle switching assembly is disposed between the cathode insulating layer and the encapsulation layer.

In some embodiments, the display panel further includes an anode insulating layer disposed between the anode layers of adjacent the light-emitting units, and the separating plate is disposed between the anode insulating layer and the encapsulation layer.

In some embodiments, a thickness of the anode insulating layer is greater than a thickness of the anode layer, and a direction of the thickness is a stacking direction of each film layer in the light-emitting unit.

In some embodiments, an adhesive layer is provided between the substrate and the separating plate and between the separating plate and the encapsulation layer.

In some embodiments, ends of the sidewall electrode abut between the substrate and the encapsulation layer, respectively.

In some embodiments, the accommodating cavity is provided with a dispersion medium.

In some embodiments, the sidewall electrode receives a first voltage value in the display sharing mode and is configured to have the first electrical polarity, and the sidewall electrode receives a second voltage value in the private protection mode and is configured to have the second electrical polarity, and wherein the first electrical polarity and the second electrical polarity are opposite.

In some embodiments, the outer surface of the charged particle includes a light-absorbing region and a reflecting region, wherein in the private protection mode, an electrical polarity of the sidewall electrode is as same as an electrical polarity of the light-absorbing region, and an electrical polarity of the sidewall electrode is opposite to an electrical polarity of the reflecting region; wherein in the display sharing mode, the electrical polarity of the sidewall electrode is opposite to the electrical polarity of the light light-absorbing region, and the electrical polarity of the sidewall electrode is as same as the electrical polarity of the reflecting region.

In some embodiments, the display device includes charged particles and charged reflective particles, wherein in the private protection mode, the electrical polarity of the sidewall electrode is as same as an electrical polarity of each of the charged particles, and the electrical polarity of the sidewall electrode is opposite to an electrical polarity of each of the charged reflective particles; wherein in the display sharing mode, the electrical property of the sidewall electrode is opposite to the electrical polarity of the charged particle, and the electrical polarity of the sidewall electrode is as same as the electrical polarity of the charged reflective particle.

Beneficial Effects

A display panel and a display device are provided, wherein a sidewall electrode and charged particles are disposed in an accommodating cavity defining by a substrate, a separating plate, and an encapsulation layer. The charged particles are attracted by controlling the electrical polarity of the sidewall electrode in order to switch a display panel into a private protection mode, without greatly increasing the thickness of the display panel.

BRIEF DESCRIPTION OF THE DRAWINGS

The technical solution and other beneficial effects of the present disclosure will be apparent from the following detailed description of specific embodiments thereof, taken in conjunction with the accompanying drawings.

Figure 1:
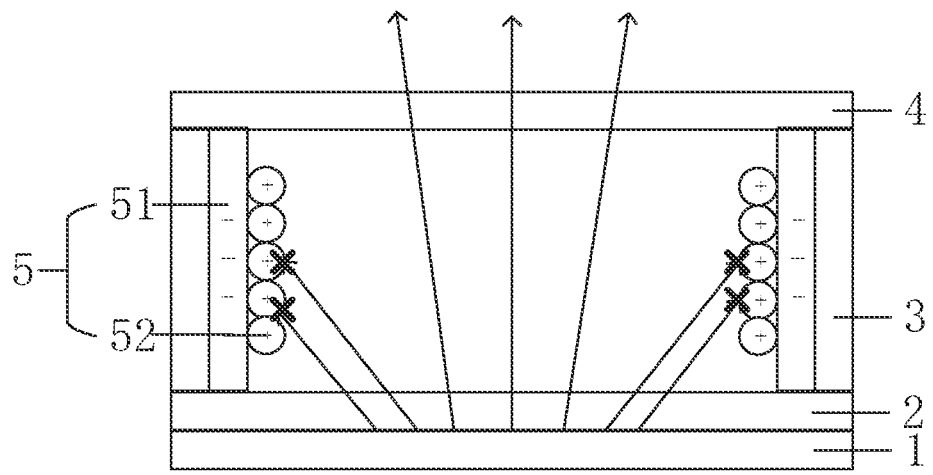
FIG. 1 is a schematic structural diagram of a display panel according to an embodiment of the present disclosure.

REFERENCE NUMERALS 1. substrate; 2. light-emitting layer; 21. light-emitting unit; 211. anode layer; 212. light-emitting layer; 213. cathode layer; 214. cathode insulating layer; 3. separating plate; 4. encapsulation layer; 5. view angle switching assembly; 51. sidewall electrode; 52. charged particles; 6. anode insulating layer.

DETAILED DESCRIPTION OF THE EMBODIMENTS

The technical solution in the embodiments of the present disclosure will be clearly and completely described with reference to the accompanying drawings. It should be apparent that the described embodiments are only part of the examples of the present disclosure, and not all examples. Based on the embodiments in the present disclosure, all other embodiments obtained by a person skilled in the art without any inventive effort are within the scope of the present disclosure.

In the description of this disclosure, it should be understood that the azimuth or positional relationship indicated by the terms "center", "longitudinal", "transverse", "length", "width", "thickness", "up", "down", "front", "back", "left", "right", "vertical", "horizontal", "top", "bottom", "inner", "outer", "clockwise", "counterclockwise", and the like, is based on the drawings, and it is merely to describe this disclosure and to simplify the description, and is not intended to indicate or imply that the device or element referred to must have a particular azimuth, be constructed and operated in a particular azimuth, and therefore is not to be construed as limiting the disclosure. Furthermore, the terms "first" and "second" are used for descriptive purposes only and are not to be construed as indicating or implying relative importance or implying the number of indicated technical features. Thus, features defined as "first", "second" may expressly or implicitly include one or more of said features. In the description of the present disclosure, "a plurality of" means two or more, unless otherwise expressly and specifically defined.

In the description of the present disclosure, it should be noted that, unless expressly stated and defined otherwise, the terms "mount", "connected with", "connected to" are to be understood in a broad sense, for example, as a fixed connection, as a detachable connection, as an integrated connection, as a mechanically connection, as an electrically connection or in communication with each other; alternatively as a directly connection or an indirectly connection by means of an intermediate medium, an internal communication of the two elements or an interaction of the two elements. The specific meaning of the above terms in this disclosure may be understood by one of ordinary skill in the art depending on the specific circumstances.

Unless otherwise expressly specified and defined, a first feature "on" or "under" a second feature may represent the first feature directly contacting with the second feature, or may represent the first feature indirectly contacting with the second feature, i.e., the first feature contacting the second feature through additional features therebetween. Also, the first feature "above", "over" and "above" the second feature may represent the first feature directly above and obliquely above the second feature, or simply means that the first feature is higher than the second feature. The first feature "below", "below" and "below" the second feature may represent the first feature directly below and obliquely below the second feature, or simply means that the first feature is lower than the second feature.

The following disclosure provides many different embodiments or examples for implementing the different structures of the present disclosure. In order to simplify the disclosure of the present disclosure, components and arrangements of specific examples are described below. They are merely examples and are not intended to limit the disclosure. In addition, the present disclosure may repeat reference numerals and/or reference letters in various instances for the purpose of simplicity and clarity, without indicating a relationship between the various embodiments and/or arrangements discussed. In addition, the present disclosure provides examples of various specific processes and materials, but one of ordinary skill in the art will recognize the disclosure of other processes and/or the use of other materials.

As shown in FIG. 1, a display panel including a substrate 1, a light-emitting layer 2, a separating plate 3, an encapsulation layer 4, and a viewing angle switching assembly 5 is provided. The substrate 1 is configured to support components provided thereon. The type of the substrate 1 is not specifically limited in the present embodiment, and may be a glass substrate or the like. The light-emitting layer 2 is disposed on the substrate 1, the separating plate 3 is disposed in a loop on the light-emitting layer 2, and the encapsulation layer 4 is disposed on a side of the separating plate 3 away from the substrate 1. The substrate 1, the separating plate 3, and the encapsulation layer 4 cooperate to define a closed accommodating cavity. The display panel may include a plurality of separating plates 3, so that the plurality of separating plates 3 may cooperate with substrate 1 and the encapsulation layer 4 to define a plurality of accommodating cavities.

The viewing angle switching assembly 5 is provided in the accommodating cavity and in a one-to-one correspondence with the accommodating cavity. Since the viewing angle switching assembly 5 is provided in the accommodating cavity and charged particles 52 are included in the viewing angle switching assembly 5, the substrate 1, the separating plate 3, and the encapsulation layer 4 are provided as insulating members.

The viewing angle switching assembly 5 includes a sidewall electrode 51 provided on a side wall of the separating plate 3, and charged particles 52 provided in the accommodating cavity. An outer surface of the charged particles 52 includes a light-absorbing region toward an inner of the accommodating cavity. Lights emitted from the light-emitting layer 2 are absorbed by the charged particles 52 in the light-absorbing region, and no lights are reflected out. The charged particles 52 may be ink particles or the like.

The charged particles have first electrical polarities, and when a private protection mode is selected, the sidewall electrode 51 is controlled to have an opposite polarity to the charged particles 52. The sidewall electrode 51 is configured to have a second electrical polarity. The first electrical polarity and the second electrical polarity are opposite, so that the charged particles 52 are attracted to the sidewall electrode 51 in the private protection mode, and the light-absorbing region of the charged particles 52 toward an inner of the accommodating cavity. Therefore, as shown in FIG. 1, the lights irradiating on the side wall of the separating plate 3 are absorbed by the light-absorbing region of the charged particles 52. When a user views from a front of a display panel, the lights irradiating in a middle region of the accommodating cavity reach human eyes, thus, images are appeared to the user. When a spectator views from a direction obliquely away from the display panel, the lights irradiating on the side wall are absorbed by the light-absorbing region of the charged particles 52, thus, these lights are blocked from being transmitted to the spectator, and the spectator cannot observe the images. As such, the viewing angle of the display panel is limited or reduced by the light-absorbing region of the charged particles 52 absorbing the lights, thereby achieving a private protection effect. It should be noted that the electrical polarity of the charged particles 52 in the figures are merely illustrative and should not be construed as limited thereto.

Figure 2:
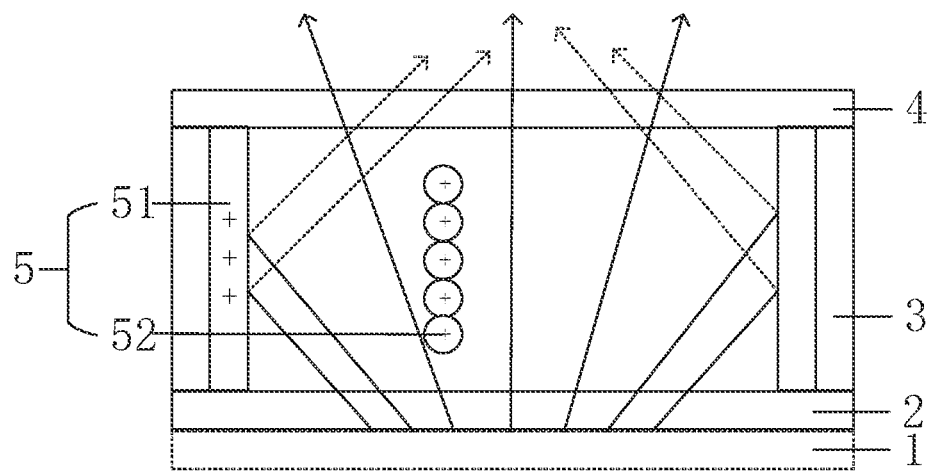
FIG. 2 is a schematic structural diagram of a display panel according to an embodiment of the present disclosure.

When a display sharing mode of the display panel is selected, the sidewall electrode 51 is controlled to have a same electrical polarity with the charged particles 52, or the sidewall electrode 51 is controlled to be uncharged. As such, the charged particles 52 are not attracted to the sidewall electrode 51. Therefore, as shown in FIG. 2, the lights irradiating on the side wall of the separating plate 3 is reflected by the separating plate 3. When the user views from the front of the display panel, the light irradiating in the middle region of the accommodating cavity reach the human eyes, thus, images are appeared to the user. Since the lights irradiating on the side wall of the separating plate 3 are reflected at random by the sidewall electrode 51, the images also can be observed by spectator who views from a direction obliquely away from the display panel. At this time, the viewing angle of the display panel is not limited or reduced.

It should be noted that the electrical polarity of the sidewall electrode 51 may be provided on the side wall of the separating plate 3 or controlled based on the direction of the viewing angle to be limited. For example, if the viewing angle around the display panel needs to be limited, the sidewall electrode 51 is provided on each inner side of the separating plate 3, and the electrical polarity of each sidewall electrode 51 is controlled simultaneously. In addition, if only the viewing angle in the left and right directions of the user needs to be limited, the inner sides of the separating plate 3 corresponding to the left and right directions are provided with the sidewall electrode 51 for subsequent control; alternatively, the sidewall electrode 51 is likewise arranged on each inner side of the separating plate 3, but only the sidewall electrodes 51 corresponding to the left and right directions are turned on under control, and the sidewall electrodes 51 corresponding to the other direction are turned off.

Here, the electrical polarity of the sidewall electrode 51 can be controlled by adjusting a voltage value input to the sidewall electrode 51. The sidewall electrode 51 receives a first voltage value in the display sharing mode and is configured to have a first electrical polarity. The sidewall electrode 51 receives a second voltage value in the private protection mode and is configured to have a second electrical polarity.

In this embodiment, the sidewall electrode 51 is disposed on the side wall of the separating plate 3, and the charged particles 52 are attracted by controlling the electrical polarity of the sidewall electrode 51, so that switching between the display sharing mode and the private protection mode is achieved, without greatly increasing the thickness of the display panel.

In an embodiment, the viewing angle switching assembly 5 further includes charged reflective particles (not shown) disposed in the accommodating cavity. The charged reflective particles and the charged particles 52 are different particles, and the electrical polarities of the charged particles 52 are opposite to the electrical polarities of the charged reflective particles, i.e., the charged reflective particles have a second electrical polarity. When the private protection mode is selected, the electrical polarity of the sidewall electrode 51 is opposite to the electric polarities of the charged particles 52, and the charged particles 52 are attracted to the sidewall electrode 51. When the display sharing mode is selected, the electrical polarity of the sidewall electrode 51 is controlled to be as same as the electrical polarities of the charged particles 52, and the charged reflective particles are attracted to the sidewall electrode 51, thus, the lights irradiating on the side wall are repeatedly reflected by the charged reflective particles and finally randomly emitted. Compared with reflecting only through the sidewall electrode 51, the viewing angle of the display panel is much larger owe to the charged reflective particles.

Figure 3:
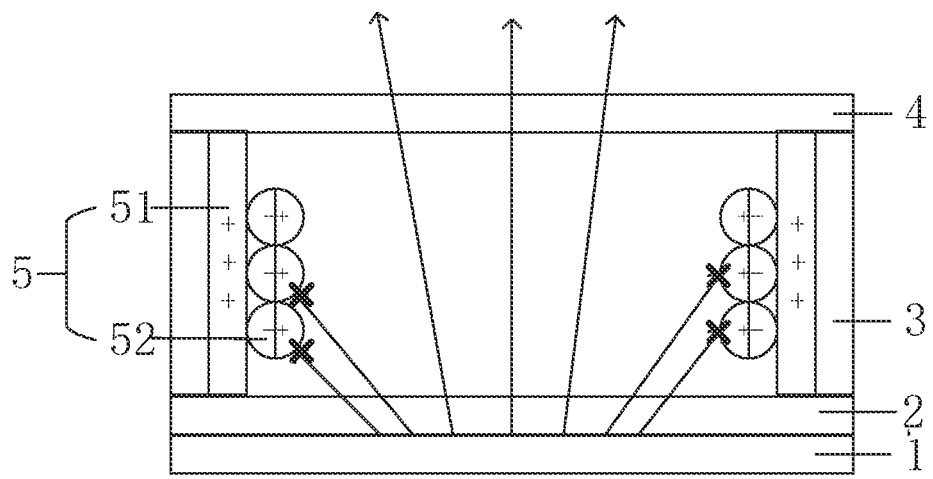
FIG. 3 is a schematic structural diagram of a display panel according to an embodiment of the present disclosure.
Figure 4:
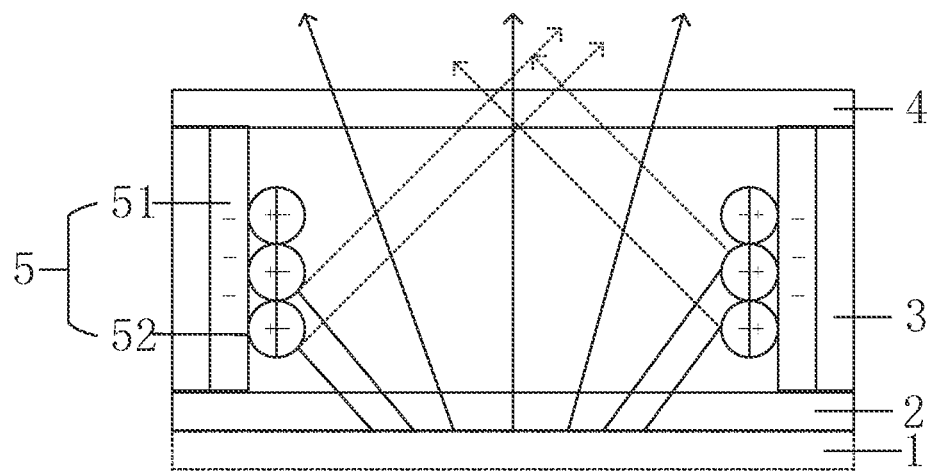
FIG. 4 is a schematic structural diagram of a display panel according to an embodiment of the present disclosure.

In an embodiment, as shown in FIGS. 3 and 4, in addition to the provision of the charged particles 52 and the charged reflective particles, the charged particles 52 including the light-absorbing region and the reflecting region may be provided. The light-absorbing region absorbs the lights and the reflecting region reflects the lights. The charged particles 52 may be coated with a light absorbing layer and a reflective layer, respectively, to define a corresponding light-absorbing region and a corresponding reflecting region. The electrical polarity of the light-absorbing region and the electrical polarity of the reflecting region are opposite. In any mode, the charged particles 52 are attracted on the sidewall electrode 51. The difference between the modes is that, as shown in FIG. 3, when the private protection mode is selected, the electrical polarity of the sidewall electrode 51 is controlled to be as same as the electrical polarity of the light-absorbing region. Since the reflecting region has an opposite electrical polarity to the light-absorbing region and the sidewall electrode 51, the charged particles 52 are attracted to the sidewall electrode 51 with the reflecting region close to the sidewall electrode 51 and the light-absorbing region away from the sidewall electrode 51. As such, the lights enter the light-absorbing region and no lights are reflected out, thereby achieving an anti-peeping effect. On the contrary, as shown in FIG. 4, when the display sharing mode is selected, the electrical polarity of the sidewall electrode 51 is controlled to be opposite to the electrical polarity of the light-absorbing region. Since the reflecting region has a same electrical polarity with the sidewall electrode 51, the charged particles 52 are attracted to the sidewall electrode 51 with the light-absorbing region close to the sidewall electrode 51 and the reflecting region away from the sidewall electrode 51. As such, the lights enters the reflecting region, and are reflected a plurality of times, thereby enlarging the viewing angle.

In an embodiment, when the charged particles 52 includes both the light-absorbing region and the reflecting region, in order to avoid the lights from entering the reflecting region and being reflected out when the private protection mode is selected, an area of the light-absorbing region is set to be greater than or equal to an area of the reflecting region.

Figure 5:
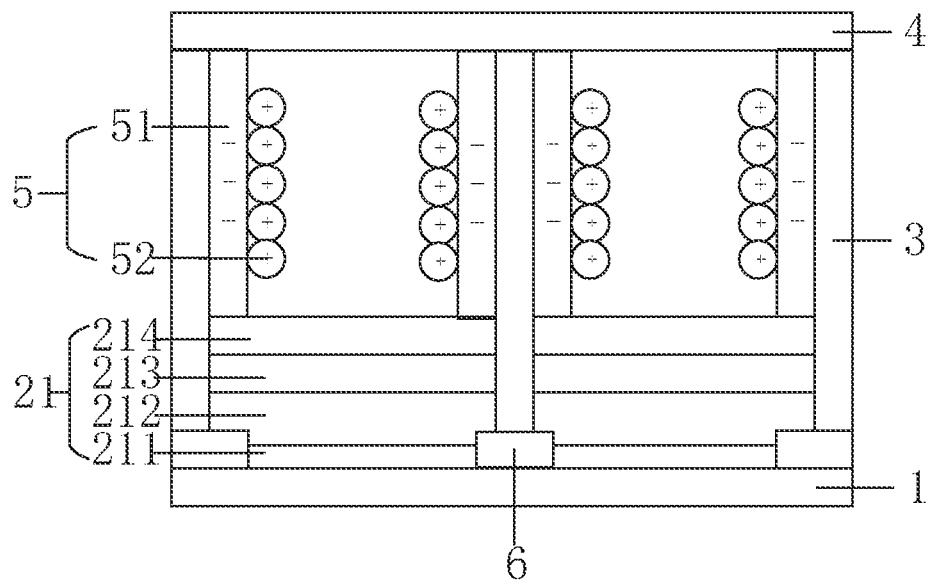
FIG. 5 is a schematic structural diagram of a display panel according to an embodiment of the present disclosure.

In an embodiment, as shown in FIG. 5, the display panel further includes a light-emitting unit 21 provided in each accommodating cavity, wherein the light-emitting unit 21 is provided on the substrate 1, and each light-emitting unit 21 is disposed corresponding to each pixel to illuminate the corresponding pixel. The viewing angle switching assembly 5 is provided between the light-emitting unit 21 and the encapsulation layer 4, and the lights emitted from the light-emitting unit 21 enter into the corresponding accommodating cavity, as such, the switching to the private protection mode is realized by the corresponding viewing angle switching assembly 5.

In an embodiment, as shown in FIG. 5, the light-emitting unit 21 includes an anode layer 211, a light-emitting layer 212, a cathode layer 213, and a cathode insulating layer 214 which are stacked in sequence, wherein the anode layer 211 is provided on the substrate 1. The viewing angle switching assembly 5 is disposed between the cathode insulating layer 214 and the encapsulation layer 4, wherein the cathode insulating layer 214 is configured to isolate charged particles in the cathode layer 213 and the viewing angle switching assembly 5. The light light-emitting layer 212 is controlled by the anode and the cathode to emit lights, and the lights emitted from the light-emitting layer 212 enter into the corresponding accommodating cavity, and then the switching to the private protection mode is realized by the corresponding viewing angle switching assembly 5.

In an embodiment, in order to further isolate the electrical coupling effect between the anode layers 211 of the adjacent light-emitting units 21, the display panel further includes an anode insulating layer 6 disposed between the anode layers 211 of the adjacent light-emitting units 21, and the separating plate 3 is disposed between the anode insulating layer 6 and the encapsulation layer 4.

Here, in order to achieve the insulating effect, as shown in FIG. 5, a thickness of the anode insulating layer 6 is greater than a thickness of the anode layer 211, wherein the thickness indicates a direction along which each film layer in the light-emitting unit 21 are stacked.

In an embodiment, an adhesive layer is provided between the substrate 1 and the separating plate 3 and between the separating plate 3 and the encapsulation layer 4 for adhesive sealing in order to achieve a good encapsulation sealing effect. The adhesive layer may be optical clear adhesive (OCA) or the like.

In an embodiment, in order to facilitate the movement of the charged particles 52, a dispersion medium is provided in the accommodating cavity. The dispersion medium (not shown) is a common one in the field of electrophoresis, and details are not described in the present embodiment.

In an embodiment, to avoid the charged particles 52 from failing to be attracted on the side wall due to leaks existing on the side wall, ends of the sidewall electrode 51 abut between the encapsulation layer 4 and the substrate 1, respectively. Or, as shown in FIG. 5, ends of the sidewall electrode 51 abut between the encapsulation layer 4 and the cathode insulating layer 214, respectively.

According to the present embodiment, the sidewall electrode 51 and the charged particles 52 are provided in the accommodating cavity defining by the substrate 1, the separating plate 3, and the encapsulation layer 4. The electrical polarity of the sidewall electrode 51 is controlled to attract the charged particles 52 to the sidewall electrode 51 to switch into the private protection mode, without greatly increasing the thickness of the display panel.

An embodiment of the present disclosure provides a display device including the display panel according to any one of the above embodiments.

In some embodiments, the display panel includes:
a substrate 1;
a light-emitting layer 2 disposed on the substrate 1;
a plurality of separating plates 3 disposed on the light-emitting layer 2;
an encapsulation layer 4 disposed on a side of the plurality of separating plates 3 away from the substrate 1, wherein the substrate 1, the plurality of separating plates 3, and the encapsulation layer 4 define a plurality of accommodating cavities; and
a viewing angle switching assembly 5 provided in each of the plurality of accommodating cavities and in a one-to-one correspondence with the accommodating cavity, wherein the viewing angle switching assembly 5 includes a sidewall electrode 51 provided on a side wall of the separating plate 3 and charged particles 52 provided in the accommodating cavity, the charged particles 52 have a first electrical polarity, and outer surfaces of the charged particles include an light-absorbing region; wherein in a private protection mode, the sidewall electrode 51 is configured to have a second electrical polarity, the light-absorbing region toward an inner of the accommodating cavity, and the first electrical polarity and the second electrical polarity are opposite.

In some embodiments, outer surfaces of the charged particles 52 includes a light-absorbing region with a second electrical polarity and a reflecting region with a first electrical polarity. In a display sharing mode, the sidewall electrode 51 is configured to have the first electrical polarity.

In some embodiments, an area of the light-absorbing region is greater than or equal to an area of the reflecting region.

In some embodiments, the viewing angle switching assembly 5 further includes charged reflective particles disposed in the accommodating cavity, wherein the charged reflective particles have the second electrical polarity. In a display sharing mode, the sidewall electrode 51 is configured to have the first electrical polarity.

In some embodiments, the light-emitting layer 2 includes a light-emitting unit 21 provided in the accommodating cavity, wherein the light-emitting unit 21 is disposed on the substrate 1, and the view angle switching assembly 5 is disposed between the light-emitting unit 21 and the encapsulation layer 4.

In some embodiments, the light-emitting unit 21 includes an anode layer 211, a light-emitting layer 212, a cathode layer 213, and a cathode insulating layer 214 which are stacked in sequence, wherein the anode layer 211 is disposed on the substrate 1. The viewing angle switching assembly 5 is disposed between the cathode insulating layer 214 and the encapsulation layer 4.

In some embodiments, the display panel further includes an anode insulating layer 6 disposed between the anode layers 211 of the adjacent light-emitting units 21, and the separating plate 3 is disposed between the anode insulating layer 6 and the encapsulation layer 4.

In some embodiments, a thickness of the anode insulating layer 6 is greater than a thickness of the anode layer 211, wherein the thickness indicates a direction along which each film layer in the light-emitting unit 21 are stacked.

In some embodiments, an adhesive layer is provided between the substrate 1 and the separating plate 3 and between the separating plate 3 and the encapsulation layer 4.

In some embodiments, ends of the sidewall electrode 51 abut between the encapsulation layer 4 and the substrate 1, respectively.

In some embodiments, the accommodating cavity is provided with a dispersion medium.

In some embodiments, the sidewall electrode 51 receives a first voltage value in the display sharing mode and is configured to have a first electrical polarity. The sidewall electrode 51 receives a second voltage value in the private protection mode and is configured to have a second electrical polarity. The first electrical polarity and the second electrical polarity are opposite.

In some embodiments, the outer surface of each of the charged particles includes a light-absorbing region and a reflecting region. In the private protection mode, the electrical polarity of the sidewall electrode is as same as the electrical polarity of the light-absorbing region, and the electrical polarity of the sidewall electrode is opposite to the electrical polarity of the reflecting region. In the display sharing mode, the electrical polarity of the sidewall electrode is opposite to the electrical polarity of the light light-absorbing region, and the electrical polarity of the sidewall electrode is as same as the electrical polarity of the reflecting region.

In some embodiments, the display device includes charged particles 52 and charged reflective particles. In the private protection mode, the electrical polarity of the sidewall electrode 51 is as same as the electrical polarity of the charged particles 52, and the electrical polarity of the sidewall electrode 51 is opposite to the electrical polarity of the charged reflective particles. In the display sharing mode, the electrical polarity of the sidewall electrode 51 is opposite to the electrical polarity of the charged particles 52, and the electrical polarity of the sidewall electrode 51 is as same as the electrical polarity of the charged reflective particles.

In the above-mentioned embodiments, the description of each embodiment has its own emphasis, and parts not described in detail in a certain embodiment may be referred to the related description of other embodiments.

Each of the technical features in the above embodiments may be combined arbitrarily. For the sake of brevity, not all possible combinations of each of the technical features in the above embodiments have been described. However, the combinations of these technical features should be considered to be within the scope of the present description as long as they do not contradict each other.

The foregoing describes in detail a display panel, a method for manufacturing a display panel, and a display device according to embodiments of the present disclosure, and the principles and embodiments of the present disclosure are described herein using specific examples. The description of the above embodiments is merely provided to help understand the present disclosure and the core idea thereof. At the same time, with the teachings of the present disclosure, variations may occur to those skilled in the art, and in light of the foregoing description, the present disclosure is not to be construed as limiting.

What is claimed is:

1. A display panel, comprising:
   a substrate;
   a light-emitting layer disposed on the substrate;
   a plurality of separating plates disposed on the light-emitting layer;
   an encapsulation layer disposed on a side of the separating plate away from the substrate, wherein the substrate, the plurality of separating plates, and the encapsulation layer define a plurality of accommodating cavities; and
   a viewing angle switching assembly provided in each of the plurality of accommodating cavities and in a one-to-one correspondence with the accommodating cavity, wherein the viewing angle switching assembly includes a sidewall electrode provided on a side wall of the separating plate and charged particles provided in the accommodating cavity, each of the charged particles has a first electrical polarity, and an outer surface of the charged particle includes a light-absorbing region; wherein in a private protection mode, the sidewall electrode is configured to have a second electrical polarity, the light-absorbing region is toward an inner of the accommodating cavity, and the first electrical polarity and the second electrical polarity are opposite;
   wherein the light-emitting layer comprises a light-emitting unit provided in the accommodating cavity, the light-emitting unit is disposed on the substrate, and the viewing angle switching assembly is disposed between the light-emitting unit and the encapsulation layer; wherein the light-emitting unit comprises an anode layer, a light-emitting layer, a cathode layer, and a cathode insulating layer stacked in sequence, and the anode layer is disposed on the substrate, and wherein the viewing angle switching assembly is disposed between the cathode insulating layer and the encapsulation layer.

2. The display panel of claim 1, wherein the outer surface of the charged particle further comprises a reflecting region; wherein the light-absorbing region has the second electrical polarity, and the reflecting region has the first electrical polarity; and wherein in a display sharing mode, the sidewall electrode is configured to have the first electrical polarity.

3. The display panel of claim 2, wherein an area of the light-absorbing region is greater than or equal to an area of the reflecting region.

4. The display panel of claim 1, wherein the viewing angle switching assembly further comprises charged reflective particles disposed in the accommodating cavity, and the charged reflective particles have the second electrical polarity; and wherein the sidewall electrode is configured to have the first electrical polarity in a display sharing mode.

5. The display panel of claim 1, wherein the display panel further comprises an anode insulating layer provided between the anode layers of adjacent light-emitting units, and the separating plate is disposed between the anode insulating layer and the encapsulation layer.

6. A display panel, comprising:
   a substrate;

a light-emitting layer disposed on the substrate;

a plurality of separating plates disposed on the light-emitting layer;

an encapsulation layer disposed on a side of the separating plate away from the substrate, wherein the substrate, the plurality of separating plates, and the encapsulation layer define a plurality of accommodating cavities; and a viewing angle switching assembly provided in each of the plurality of accommodating cavities and in a one-to-one correspondence with the accommodating cavity, wherein the viewing angle switching assembly includes a sidewall electrode provided on a side wall of the separating plate and charged particles provided in the accommodating cavity, each of the charged particles has a first electrical polarity, and an outer surface of the charged particle includes an light-absorbing region; wherein in a private protection mode, the sidewall electrode is configured to have a second electrical polarity, the light-absorbing region is toward an inner of the accommodating cavity, and the first electrical polarity and the second electrical polarity are opposite.

7. The display panel of claim 6, wherein the outer surface of the charged particle further comprises a reflecting region; wherein the light-absorbing region has the second electrical polarity, and the reflecting region has the first electrical polarity; and wherein in a display sharing mode, the sidewall electrode is configured to have the first electrical polarity.

8. The display panel of claim 7, wherein an area of the light-absorbing region is greater than or equal to an area of the reflecting region.

9. The display panel of claim 6, wherein the viewing angle switching assembly further comprises charged reflective particles disposed in the accommodating cavity, and the charged reflective particles have the second electrical polarity; and wherein the sidewall electrode is configured to have the first electrical polarity in a display sharing mode.

10. The display panel of claim 6, wherein the light-emitting layer comprises a light-emitting unit provided in the accommodating cavity, the light-emitting unit is disposed on the substrate, and the viewing angle switching assembly is disposed between the light-emitting unit and the encapsulation layer.

11. The display panel of claim 10, wherein the light-emitting unit comprises an anode layer, a light-emitting layer, a cathode layer, and a cathode insulating layer stacked in sequence, and the anode layer is disposed on the substrate, and wherein the viewing angle switching assembly is disposed between the cathode insulating layer and the encapsulation layer.

12. The display panel of claim 11, wherein the display panel further comprises an anode insulating layer provided between the anode layers of adjacent light-emitting units, and the separating plate is disposed between the anode insulating layer and the encapsulation layer.

13. The display panel of claim 12, wherein a thickness of the anode insulating layer is greater than a thickness of the anode layer, and a direction of the thickness is a stacking direction of each layer in the light-emitting unit.

14. The display panel of claim 6, wherein an adhesive layer is provided between the substrate and the separating plate and between the separating plate and the encapsulation layer.

15. The display panel of claim 6, wherein ends of the sidewall electrode abut between the substrate and the encapsulation layer, respectively.

16. The display panel of claim 6, wherein the accommodating cavity is provided with a dispersion medium.

17. A display device, wherein the display device comprises the display panel of claim 6.

18. The display device of claim 17, wherein the sidewall electrode receives a first voltage value in the display sharing mode and is configured to have the first electrical polarity, and the sidewall electrode receives a second voltage value in the private protection mode and is configured to have the second electrical polarity, and wherein the first electrical polarity and the second electrical polarity are opposite.

19. The display device of claim 17, wherein the outer surface of the charged particle comprises a light-absorbing region and a reflecting region, wherein in the private protection mode, an electrical polarity of the sidewall electrode is as same as an electrical polarity of the light-absorbing region, and an electrical polarity of the sidewall electrode is opposite to an electrical polarity of the reflecting region; wherein in the display sharing mode, the electrical polarity of the sidewall electrode is opposite to the electrical polarity of the light light-absorbing region, and the electrical polarity of the sidewall electrode is as same as the electrical polarity of the reflecting region.

20. The display device of claim 17, wherein the display device comprises the charged particles and charged reflective particles, wherein in the private protection mode, the electrical polarity of the sidewall electrode is as same as an electrical polarity of the charged particle, and the electrical polarity of the sidewall electrode is opposite to an electrical polarity of each of the charged reflective particles; wherein in the display sharing mode, the electrical property of the sidewall electrode is opposite to the electrical polarity of the charged particle, and the electrical polarity of the sidewall electrode is as same as the electrical polarity of the charged reflective particle.

* * * * *